Dec. 27, 1960 W. F. NEWBOLD 2,966,631
STABILIZED DIRECT CURRENT AMPLIFIER
Filed April 21, 1955
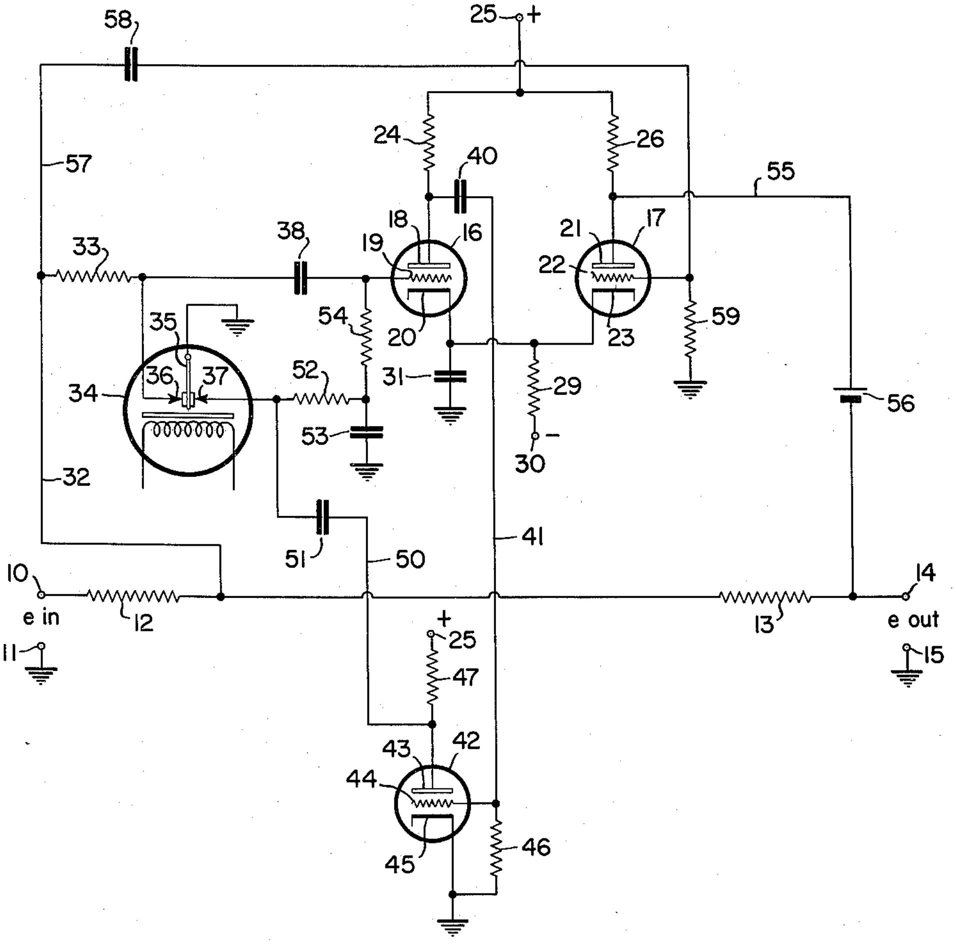
INVENTOR.
WILLIAM F. NEWBOLD
BY Henry L. Hanson
ATTORNEY.

United States Patent Office 2,966,631

Patented Dec. 27, 1960

2,966,631

STABILIZED DIRECT CURRENT AMPLIFIER

William F. Newbold, Chestnut Hill, Pa., assignor to Minneapolis-Honeywell Regulator Company, Minneapolis, Minn., a corporation of Delaware Filed Apr. 21, 1955, Ser. No. 502,937

3 Claims. (Cl. 330—9)

A general object of the present invention is to provide a new and improved electrical signal amplifying apparatus. More specifically, the present invention relates to a direct current amplifier of the converter stabilized type which is characterized by its high order of stability and freedom from drift while requiring a minimum of electrical components in the overall circuit.

Direct current amplifiers are frequently required in electrical control problems wherein amplified direct current signals are required for control purposes. A prior art method of amplifying a direct current is to use a direct coupled amplifier wherein each of the individual amplifying stages of the amplifier are directly coupled to each other. The amplifiers of this general type are difficult to stabilize and frequently drift in such a manner that they cannot be depended upon for accurate control applications. It has also been proposed in the prior art to overcome the difficulties of drift and zero stability by the use of a signal conversion unit which changes an input direct current signal to an alternating current signal. The alternating current signal is then amplified and then reconverted on the output to a direct current signal.

In some devices of this general type it has been the practice to place a differential amplifier in the position of final output stage of the amplifier where additional amplification was required. Such additional circuitry has proved costly due to the requirement of additional components and circuit complexity resulting in undesirably increased service and manufacturing problems. The present invention is directed to simplification of such stabilized direct current amplifiers without any sacrifice in the gain of the amplifier or sacrifice in the required operational characteristics.

It is therefore a more specific object of the present invention to provide a new and improved direct current stabilized amplifier using a converter directly in combination with a differential amplifier.

The present invention incorporates a stabilized amplifier using a differential amplifier and a zero stable signal conversion device. Instead of using the differential amplifier only as a direct current amplifier, as has been done heretofore, the present invention is directed to the use of the differential amplifier both as an alternating current amplifier and as a direct current amplifier to the end of simplifying the circuit and obtaining maximum use of the components used in the circuit.

It is therefore a further object of the present invention to provide a differential amplifier which is operative to amplify alternating current and direct current signals simultaneously.

A still further object of the present invention is to provide a stable direct current amplifier incorporating a differential amplifier which is operative to amplify the alternating current and direct current inputs received from a signal converter.

Still another object of the present invention is to provide a new and improved stable direct current amplifier in which an input direct current is converted to an alternating current, the alternating current is amplified by means including a differential amplifier, is then reconverted to a direct current, and is then again amplified by the differential amplifier.

The various features of novelty which characterize the invention are set forth with particularity in the claims annexed hereto and forming a part of the specification. For a better understanding of the invention, its advantages, and specific objects attained with its use, reference should be had to the accompanying drawings and descriptive matter in which there is illustrated and described preferred embodiments of the invention.

Referring to the single figure, the numerals 10 and 11 define the electrical input terminals of the apparatus which are adapted to be connected to a source of direct current. A summing resistor 12 is connected between the input terminal 10 and a further summing resistor 13 which is an effective feedback resistor. Resistor 13 is connected to an output terminal 14, the latter of which cooperates with a further output terminal 15 to form the output circuit of the present apparatus. It is the purpose of the present apparatus to sense the amplitude of the signal on the input terminals 10 and 11 and produce on the output terminals 14 and 15 a corresponding signal of amplified value.

The amplifier proper is built around a differential amplifier which comprises a pair of triode amplifying devices 16 and 17. The triode 16 comprises an anode 18, a control electrode 19, and a cathode 20. The triode 17 comprises an anode 21, a control electrode 22, and a cathode 23. A resistor 24 connects the anode 18 to a positive power supply terminal 25. A resistor 26 connects the anode 21 to the same power supply terminal 25. The cathodes 20 and 23 are joined together and are connected by way of a cathode resistor 29 to a further power supply terminal 30. The resistor 29 is bypassed to ground by way of a bypass condenser 31.

The input to the differential amplifier is supplied from the junction point between the input summing resistor 12 and the feedback resistor 13 by way of a lead 32 and a resistor 33. The resistor 33 is adapted to have one end thereof periodically connected to ground by means of a signal converter 34 which comprises a movable switch blade 35 which is adapted to be cyclically actuated between a pair of contacts 36 and 37. The output from the converter contact 36 is connected by way of a condenser 38 to the control electrode 19 of the triode 16. The input from the converter will be an alternating current signal to the triode 16 and the output of the triode 16 insofar as alternating current is concerned will be taken through a condenser 40 and a lead 41 to be applied to the input of a further amplifying triode 42. This triode comprises an anode 43, a control electrode 44, and a cathode 45. A resistor 46 is connected between the control electrode 44 and the cathode 45. A plate resistor 47 is connected to the anode 43 and to a terminal 25 which is one end of a power supply.

The output from the triode 42 is fed through lead 50 and a blocking condenser 51 to the signal conversion contact 37 of the converter 34. The output from the converting contact 37 includes a filter section which comprises a resistor 52 and a condenser 53. A further resistor 54 connects the filter to control electrode 19 and maintains the input to triode 16 high for the applied A.C. signals. The direct current signal will be applied through the differential amplifier as will be explained below and the output from the amplifier will be by way of lead 55 and battery 56.

A transient input signal path to the differential amplifier triode 17 is provided in the junction between the resistors 12 and 13 to lead 32, lead 57, and condenser 58 to the control electrode 22. The control electrode 22 is connected by way of a grid resistor 59 to ground.

Operation

In considering the operation of the present apparatus, it should first be noted that it is intended that a direct current input signal on the terminals 10 and 11 be reproduced in amplified form on the output terminals 14 and 15. With a given direct current signal on the input terminals 10 and 11, this signal will be applied through the summing resistor 12 and resistor 33 to the left contact 36 of the converter 34. When the converter switch blade 35 is switched into connection with the contact 36, the right end of the resistor 33 will be grounded. During the next half cycle when the switch blade 35 is moved against the contact 37, the right end of the resistor 32 will rise in potential to the magnitude of the signal between the resistors 12 and 13. This will result in there being produced a signal which is alternating and which will be passed through the condenser 38 to the control electrode 19.

The alternating current applied to the control electrode 19 will be amplified by the triode 16 which is functioning as an alternating current amplifier due to the presence of the bypass condenser 31 connected to the cathode 20. The output of the triode 16 will be fed from the anode 18 through the blocking condenser 40 and lead 41 to the control electrode 44 of the triode 42. The alternating current signal on the electrode 44 will be amplified by the triode 42 and the output will be coupled from the anode 43 to lead 50 and blocking condenser 51 to the right hand contact of the converter 34.

The blade 35 and the contact 37 cooperate as a rectifier unit to produce on the input to the filter resistor 52 a series of direct current pulses whose amplitude is dependent upon the amplitude of the input error signal and whose polarity is dependent upon the polarity of the input signal. This direct current signal is fed through the filter comprised of resistor 52, condenser 53 and through the resistor 54 to the input control electrode 19 of the triode 16. The direct current signal on the control electrode 19 will be passed by way of the cathode 20 to supply a biasing signal to the triode 17 with the input being on the cathode 23. The signal applied to the cathode 23 will be amplified by the triode 17 and a direct current output signal will be taken from the anode 21 and applied through lead 55 and battery 56 to output terminal 14. The magnitude of the output signal at terminal 14 will be sufficient so that the signal applied through the feedback resistor 13 will balance the input signal on input terminals 10 and 11 applied through resistor 12. The feedback through the resistor 13 will in effect balance the input signal to thereby stabilize the amplifier.

With a positive input signal on terminal 10, the amplifier will produce on the output terminal 14 a negative signal. It will be seen from the foregoing description of the operation that the amplifier serves to amplify the chopped alternating signal and, independently thereof to amplify the demodulated signal from the converter. Thus, because of the relative independence of the two aspects of the amplification, the effect is the same as if the demodulated signal were applied to additional amplification stages while, in fact, the same stage is used for the direct current amplification as was used for the alternating signal amplification. The result of this combined operational feature is a considerable simplification of the overall circuitry and elimination of a number of components heretofore required to produce an amplifier of comparable stability and gain.

If the input direct current signal is a fluctuating signal or contains transients, the transients will be applied directly to the control electrode 22 by way of the bypass condenser 58. The signals will be amplified directly by the triode 17 and the output will be taken from the anode 21 through lead 55 to the output terminal 14. This configuration will permit the apparatus to function directly to produce an output signal on terminals 14 and 15 which will follow the transients on the input terminals 10 and 11.

If it is desired to improve the transient response of an amplifier circuit of this type, additional stages of D.C. amplification may be added to the output terminals 14 and 15. These additional stages will not require the stabilization present in the amplifier described supra as the input signal levels will be sufficiently large to make any drift in the circuit negligible.

While, in accordance with the provisions of the statutes, there has been illustrated and described the best forms of the invention known, it will be apparent to those skilled in the art that changes may be made in the forms of the apparatus disclosed without departing from the spirit of the invention as set forth in the appended claims and that in certain cases, certain features of the invention may be used to advantage without a corresponding use of other features.

What is claimed as new and for which it is desired to secure Letters Patent is:

1. A stabilized direct current amplifier comprising a pair of electronic amplifying devices, each having an anode, cathode, and control electrode, means connecting the cathode of each of said devices to a direct current source through a common impedance circuit, a bypass condenser connected to said cathodes, a chopper converter, a direct current input circuit connected to said chopper and to the control electrode of one of said devices through a blocking condenser, said chopper producing an alternating current input signal on the control electrode of said one device, an alternating current output circuit connected between the anode of said one device and said chopper, said chopper converting the output signal to a direct current signal, and means including a filter connecting said last named direct current signal to the control electrode of said one device, means including said common impedance circuit for providing a direct current coupling circuit between said one device and the other device of said pair, and a direct current output circuit connected to the anode of the other of said amplifying devices.

2. An amplifier as set forth in claim 1 wherein said alternating current output circuit comprises at least one additional stage of alternating current amplification.

3. An electrical amplifier comprising a pair of amplifying devices each having an input electrode, an output electrode and a common electrode, a resistor connected as a common element in the circuit of both of said common electrodes, an alternating current by-pass capacitor connected in shunt with said common resistor whereby said pair of amplifying devices may be operated independently for alternating current signals and present a differential response to applied direct current signals, a direct current input signal circuit, a signal converter, means connecting said converter to said input circuit to convert direct current signals from said input into alternating current signals, means including direct current isolating means connecting said converter to the input electrode of one of said amplifying devices to apply said alternating current signals thereto, rectifying means, coupling means connecting said rectifying means to the output of said one of said amplifying devices to produce a second direct current signal, means connecting said second direct current signal to said input electrode of said first one of said amplifying devices for amplification thereby, and a direct current output circuit connected to the output electrode of the other of said amplifying devices.

References Cited in the file of this patent

UNITED STATES PATENTS

| | | |
|---|---|---|
| 2,459,730 | Williams | Jan. 18, 1949 |
| 2,615,064 | Stanton | Oct. 21, 1952 |
| 2,619,552 | Kerns | Nov. 25, 1952 |
| 2,741,668 | Iffland | Apr. 10, 1956 |
| 2,888,523 | Ross | May 26, 1959 |
| 2,896,027 | Smith | July 21, 1959 |